United States Patent [19]
Cameron et al.

[11] Patent Number: 5,483,165
[45] Date of Patent: Jan. 9, 1996

[54] BATTERY SYSTEM AND METHOD FOR DETERMINING A BATTERY CONDITION

[75] Inventors: David B. Cameron, Seattle; Daniel Powers, Bainbridge Island; Thomas Lyster, Bothell; Carlton Morgan, Bainbridge Island, all of Wash.

[73] Assignee: Heartstream, Inc., Seattle, Wash.

[21] Appl. No.: 182,605

[22] Filed: Jan. 14, 1994

[51] Int. Cl.$^6$ .................................................. G01N 27/27
[52] U.S. Cl. ........................... 324/427; 324/434; 320/17; 340/636
[58] Field of Search ..................... 324/426, 427, 324/429, 433, 434; 340/636; 320/15, 16, 17, 18, 6, 7

[56] References Cited

U.S. PATENT DOCUMENTS

| | | |
|---|---|---|
| 4,207,514 | 6/1980 | Klein .................................. 340/636 X |
| 4,259,639 | 3/1981 | Renirie . |
| 4,525,055 | 6/1985 | Yokoo . |
| 4,590,943 | 5/1986 | Paull et al. . |
| 4,693,119 | 9/1987 | Johnson . |
| 4,725,784 | 2/1988 | Peled et al. . |
| 5,065,084 | 11/1991 | Oogita . |
| 5,130,659 | 7/1992 | Sloan . |
| 5,162,741 | 11/1992 | Bates . |
| 5,250,905 | 10/1993 | Kuo et al. ........................... 340/636 X |

*Primary Examiner*—Kenneth A. Wieder
*Assistant Examiner*—Diep Do
*Attorney, Agent, or Firm*—Morrison & Foerster

[57] ABSTRACT

This invention is a battery monitor and battery capacity indicator that uses a sense cell in addition to the main battery to determine main battery remaining capacity and depletion condition. A parameter of the sense cell is related to the main battery capacity so that the main battery will have a minimum capacity remaining when the sense cell parameter reaches a particular value or crosses a particular threshold. In a preferred embodiment, the sense cell is a battery which is identical and of the same manufacturing lot as the battery cell or cells in the main battery pack. A current is drawn from the sense cell that is larger than the current being drawn from the main battery. When the sense cell is fully depleted, the main battery will have a remaining capacity whose magnitude depends on the relationship between the main battery current and the sense cell current.

31 Claims, 2 Drawing Sheets

BATTERY SYSTEM AND METHOD FOR DETERMINING A BATTERY CONDITION

BACKGROUND OF THE INVENTION

1. Field of the Invention

When using a battery operated device, it is often important to know when the useful life of the battery is about to end. For example, failure to indicate a low battery condition of a battery operated computer could result in data loss if the remaining power is insufficient to save the information and exit the application. As another example, knowledge of the remaining battery capacity of a battery operated medical device could be crucial in a medical emergency.

Batteries are depleted through use. Simply tracking use time or charge transfer is an insufficient measure of remaining battery capacity, however. Batteries lose charge over time even when not in use. In addition, the battery's temperature can affect its capacity and useful life. Furthermore, monitoring the electrical characteristics of a battery, such as voltage or resistance, often does not provide enough information regarding the capacity of the battery.

This invention relates to a method and apparatus for detecting and indicating a low battery capacity condition for a battery operated device.

2. Description of the Prior Art

Battery capacity detectors and indicators are known in the art. Most prior art battery capacity indicators are based on one or both of the following two methods: (1) measurement of a battery parameter, and (2) cumulative measurement of battery output. The measurements are typically made in absolute, not relative, terms. The prior art battery capacity indicators also generally include some way to compensate for the environmental effects of time and temperature.

The apparatus disclosed in Renirie U.S. Pat. No. 4,259,639 monitors the resistance of a lithium type battery. The Renirie device is based on a theoretical model that divides the effective resistance of the battery into two resistance components. The measuring circuit shunts the first resistance component $R_L$ by a capacitance so that measurement signal pulses measure only the depletion resistance $R_d$. According to the Renirie model, $R_d$ will begin to increase near the end of the battery's useful life.

Peled et al. U.S. Pat. No. 4,725,784 discloses a method for determining the state of charge of lithium batteries using periodic open circuit voltage measurements and predetermined calibration curves relating the measured voltage to residual charge on the battery. Each set of test load, test load time, and recovery time parameters define a different calibration curve for a given ambient temperature. The battery's residual capacity is displayed by a set of LED's.

Bates U.S. Pat. No. 5,162,741 discloses a battery energy monitor that measures the current delivered by the battery and estimates the remaining battery energy using a temperature compensation factor to adjust for battery capacity variations with temperature. Remaining battery life is shown on a visual display.

Other battery tracking devices are shown in Oogita U.S. Pat. No. 5,065,084 and Sloan U.S. Pat. No. 5,130,659.

SUMMARY OF THE INVENTION

This invention is a method and apparatus for detecting a specific point on a battery's capacity curve with a high degree of accuracy. Specifically, the invention is a battery monitor and battery capacity indicator that uses a sense cell in addition to the main battery to determine main battery remaining capacity and depletion condition. A parameter of the sense cell is related to the main battery capacity so that the main battery will have a minimum capacity remaining when the sense cell parameter reaches a particular value or crosses a particular threshold.

In a preferred embodiment, the sense cell is a battery which is identical and of the same manufacturing lot as the battery cell or cells in the main battery pack. A current is drawn from the sense cell that is larger than the current being drawn from the main battery. When the sense cell is fully depleted, the main battery will have a remaining capacity whose magnitude depends on the relationship between the main battery current and the sense cell current. This information may be provided to the user by an output such as a visual display.

The invention is explained in more detail below with reference to the drawings.

DETAILED DESCRIPTION OF THE PREFERRED EMBODIMENT

Figure 1:
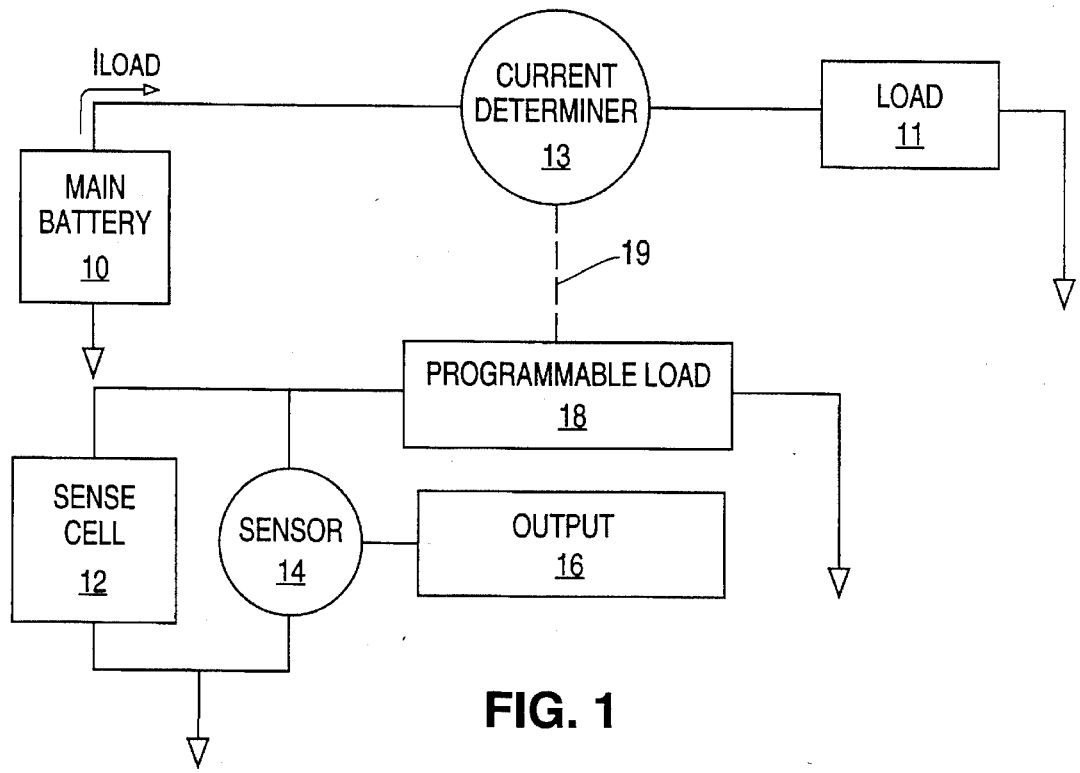
FIG. 1 is a block diagram of a battery monitor and low battery indicator according to this invention.

This invention is a battery monitor that can indicate a low main battery condition of a battery operated device without monitoring discharge time, ambient temperature or main battery voltage and resistance parameters. A block diagram of the invention is shown in FIG. 1.

A current determiner 13 determines the current $I_{LOAD}$ flowing through the main battery or battery pack 10 to a load 11. Current determiner 13 may be a current sensor that directly measures $I_{LOAD}$ or it may be some other means that sets, indirectly measures or estimates the current. For example, a voltage meter placed across a shunt in series with main battery 10 and load 11 can be used to indirectly measure the current flowing to load 11. As a further example, a microcontroller can be used to estimate the value of $I_{LOAD}$ based on known characteristics of the system and/or other parameters such as voltage, elapsed time, etc.

Current that is related to (e.g., equal, proportional to, or incrementally greater than) $I_{LOAD}$ is drawn from a separate sense cell 12 by placing a programmable load 18 between sense cell 12 and ground. The relationship between the value of $I_{LOAD}$ determined by current determiner 13 and the value of programmable load 18 is represented schematically in FIG. 1 by dotted line 19.

Sense cell 12 is preferably a battery (or a battery pack). An electrical characteristic of the sense cell (such as voltage or resistance) is determined by a sensor 14 in order to provide an indication of the remaining charge level in the main battery 10. An output 16 such as a visual display or audible alarm provides information regarding the remaining capacity of main battery 10 and/or a warning of a low battery condition.

Figure 2:
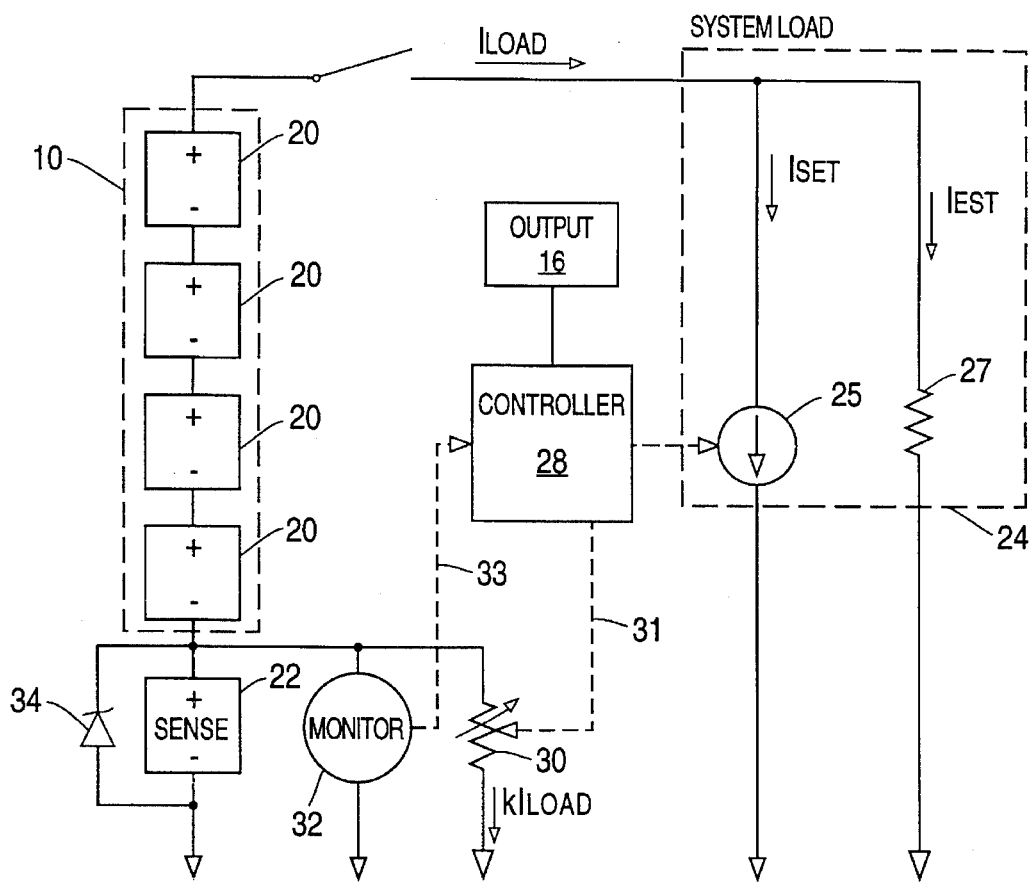
FIG. 2 is a schematic diagram showing the preferred embodiment of this invention.

A preferred embodiment of this invention is shown schematically in FIG. 2. In this embodiment, the main battery 10 is shown as a series connection of individual cells 20 which are each preferably lithium batteries of the same size, type and capacity. It should be understood, however, that the invention is not limited to lithium batteries or to a plurality of cells connected in series. The main battery and the low battery condition indicator are part of a battery operated device.

A sense cell 22 is connected in series to the main battery 10. In the preferred embodiment, sense cell 22 is identical in type and manufacturing lot to the cell or cells 20 making up main battery 10. The battery pack ideally consists of the sense cell plus the main battery cells all packaged in close proximity, so that all cells are exposed to the same environmental conditions. The outputs of main battery 10 and sense cell 22 combine to provide power to a system load of the battery operated device, shown schematically here as element 24.

In the preferred embodiment shown in FIG. 2, the system load 24 is modeled as two parallel components: a component 25 that draws a current $I_{SET}$ set by controller 28 and a component 27 whose current draw $I_{EST}$ is estimated by controller 28 based on known characteristics of system load 24. The current $I_{LOAD}$ delivered by main battery 10 is therefore the sum of $I_{SET}$ and $I_{EST}$. In addition, because sense cell 22 is connected in series with main battery 10, a current at least equal to $I_{LOAD}$ is also being drawn from sense cell 22.

Because sense cell 22 is identical in type and manufacturing lot to the cells 20 in main battery 10, the degradation of sense cell 22 and main cells 20 due to time and temperature will be identical. In order to ensure that sense cell is depleted faster than main battery 10, an incremental current $kI_{LOAD}$ is also drawn from sense cell 22, where k is an arbitrary constant. The voltage drop characteristic of lithium batteries near the end of their useful life will therefore appear first on sense cell 22. Thus, when the voltage monitored by voltage monitor 32 drops below a threshold, controller 28 outputs a low battery condition signal to output 16 to indicate that the charge on main battery 10 is nearly depleted.

To draw incremental current from sense cell 22, a variable resistance 30 between sense cell 22 and ground is set by controller 28 to a value equal to the sense cell voltage $V_{SENSE}$ determined by monitor 32 divided by the value of $kI_{LOAD}$. The constant k can be chosen to provide for a certain amount of remaining capacity in the main battery after a drop in sense cell voltage below the threshold indicates that the sense cell has been depleted. Thus, for example, the low battery indicator parameters for a battery operated computer may be selected to permit certain operations (such as closing a file) to be performed after the system output indicates a low battery condition. As another example, the parameters for a battery operated defibrillator may be selected such that the device can deliver at least one more shock to a patient after a low battery condition is indicated. A diode 34 permits the main battery 10 to continue to be used after sense cell 22 has been depleted.

Figure 3:
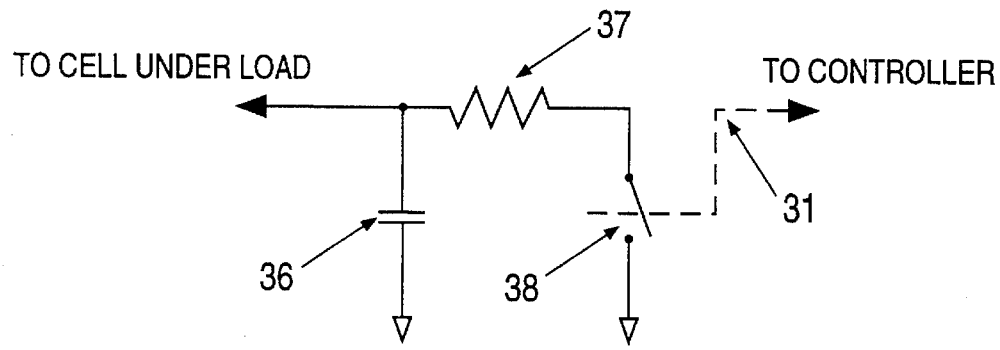
FIG. 3 is a schematic diagram showing a preferred variable resistance for use in the preferred embodiment.

FIG. 3 shows a preferred embodiment of variable resistance 30. A capacitor 36 is placed in parallel with the series combination of a resistor 37 and a switch 38 controlled from a controller via line 31. Switch 38 can be repetitively turned on and off; the amount of incremental current drawn from sense cell 22 over time depends upon the values of the capacitor and the resistor as well as the amount of time switch 38 is on. The current flow can therefore be adjusted by changing the duty cycle of switch 38.

Figure 4:
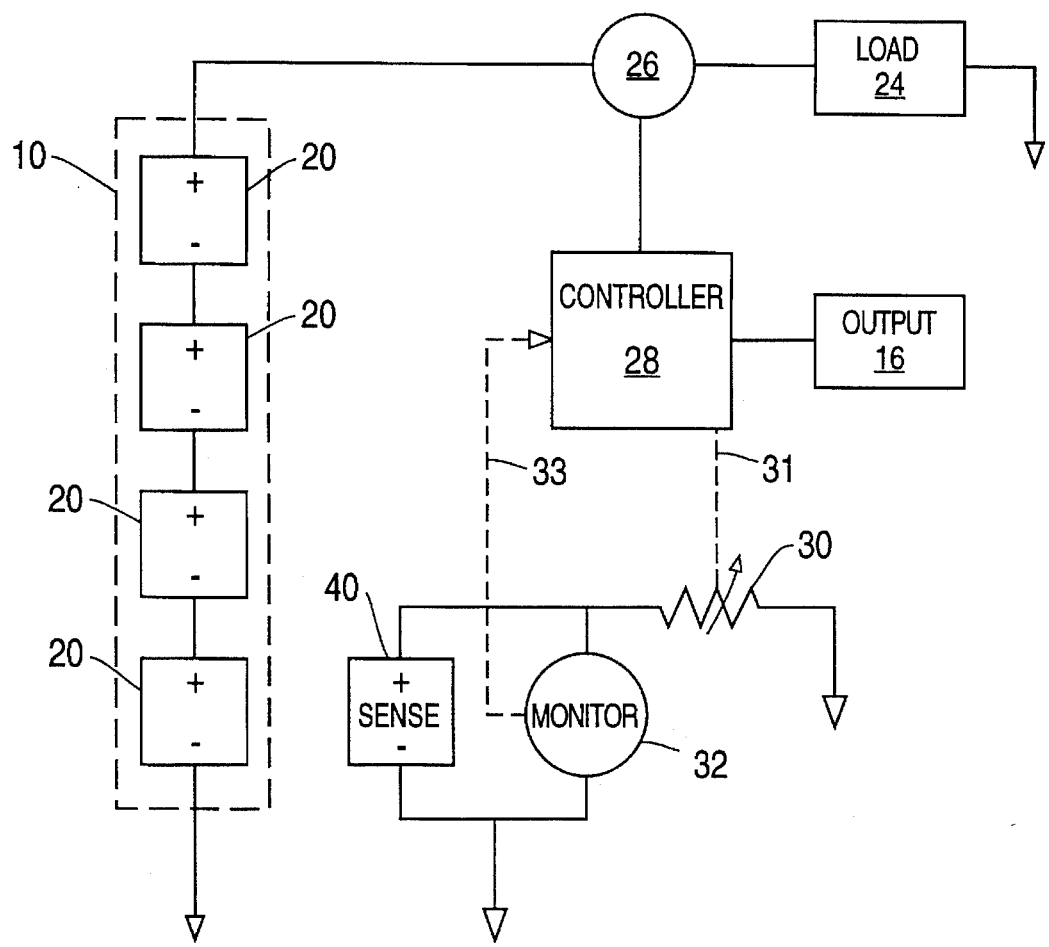
FIG. 4 is a schematic diagram showing an alternative embodiment of this invention.

An alternative embodiment of the invention is shown in FIG. 4. As in the embodiment of FIG. 2, main battery 10 is shown as a series connection of individual cells 20 which are each preferably lithium batteries. It should be understood, however, that the invention is not limited to lithium batteries or to a plurality of cells connected in series. Again, the main battery and the low battery condition indicator are part of a battery operated device.

This embodiment uses a sense cell 40 that is not part of the main battery circuit. Sense cell 40 is preferably a battery whose remaining useful life can be predicted by measuring one or more of the battery's electrical characteristics. For example, sense cell 40 could be an alkaline battery which exhibits a measurable voltage drop as its capacity is depleted.

A controller 28 monitors the current $I_{LOAD}$ delivered by main battery 10 to system load 24 via sensor 26 and draws a proportional current $kI_{LOAD}$ from sense cell 40 in the same manner as in the FIG. 2 embodiment. The value of k and the initial voltage and charge capacity of sense cell 40 may be calibrated with the initial capacity of battery 10 so that the depletion state of sense cell 40 can be used to estimate the remaining charge in battery 10.

The voltage or other electrical characteristic of sense cell 40 is monitored by the controller via monitor 32. When the sensed electrical characteristic crosses a threshold determined by the calibration between sense cell 40 and main battery 10, the controller outputs a low battery condition signal to output 16 to indicate that the charge on main battery 10 is nearly depleted. Alternatively, if the calibration between sense cell 40 and main battery 10 is precise enough, the controller and output 16 can indicate constantly or on demand the remaining charge in main battery 10 at any point from full charge to depletion.

In some embodiments, current could be added to the sense cell, rather than drawn from the sense cell as in the preferred embodiment. Thus, the sense cell could be a rechargeable battery starting from a depleted condition when the main battery is fully charged. In this way, when the main battery has been depleted, there will be additional capacity in the sense cell to provide further power to the battery operated device after exhaustion of the main battery.

In other embodiments, instead of a battery the sense cell may be some other chemical, electrochemical or electrical device having a parameter that can be related to the remaining capacity of the main battery. For example, the sense cell may be a chemical cell whose reaction rate can be controlled by the amount of current or heat applied to it. The chemical cell may be provided with a color change mechanism to indicate when a particular threshold has been reached.

Other modifications falling within the scope of this invention will be apparent to persons skilled in the art. All references cited herein are incorporated herein by reference in their entirety.

We claim:

1. A battery system comprising:
   a main battery providing current to a main load and a battery capacity indicator the battery capacity indicator comprising:
   a sense cell;
   means for affecting a parameter of the sense cell related to the remaining capacity of the main battery, the battery system further comprising a circuit connecting the sense cell in series with the main battery.

2. The battery system of claim 1 wherein the means for affecting a parameter of the sense cell comprises means for passing a current through the sense cell.

3. The battery system of claim 2 wherein the means for passing a current comprises a current determiner associated with the main battery.

4. The battery system of claim 3 wherein the current determiner comprises a current sensor measuring the current flowing from the main battery to the main load.

5. The battery system of claim 3 wherein the current determiner comprises means for estimating the current flowing from the main battery to the main load.

6. The battery system of claim 1 wherein the battery capacity indicator further comprises a sensor measuring a parameter of the sense cell.

7. The battery system of claim 1 wherein the battery capacity indicator further comprises an output and means for sending a signal related to a measured parameter of the sense cell to the output.

8. The battery system of claim 1 wherein the main battery comprises a lithium battery.

9. The battery system of claim 1 wherein the means for affecting comprises an additional load.

10. The battery system of claim 9 wherein the additional load is a programmable load.

11. The battery system of claim 1 further comprising means for preventing current from flowing from the main battery into the sense cell after the sense cell has been depleted.

12. The battery system of claim 1 wherein the sense cell is a battery of the same type as the main battery.

13. A method for determining a battery condition in a system delivering electrical power from a main battery to a load, the method comprising the following steps:

provide a sense cell connected in series with the main battery;

affecting a property of the sense cell in a manner related to main battery remaining capacity;

monitoring a parameter of the sense cell; and determining a condition of the main battery from the monitored sense cell parameter.

14. The method of claim 13 wherein the affecting step comprises passing a current through the sense cell.

15. The method of claim 14 wherein the affecting step further comprises the step of determining the current passing through the main battery.

16. The method of claim 13 further comprising the step of indicating the determined main battery condition.

17. The method of claim 13 further comprising the step of providing a programmable load electrically connected to the sense cell, wherein the affecting step comprises adjusting the programmable load.

18. The method of claim 13 wherein the main battery comprises a plurality of battery cells.

19. The method of claim 18 wherein the sense cell is substantially identical to each of the main battery cells.

20. A battery system comprising:

a main battery providing current to a main load and a battery capacity indicator, the main battery comprising a main battery cell, the battery capacity indicator comprising:

a sense cell that is substantially identical to the main battery cell; and means for affecting a parameter of the sense cell related to the remaining capacity of the main battery.

21. The battery system of claim 20 wherein the means for affecting a parameter of the sense cell comprises means for passing a current through the sense cell.

22. The battery system of claim 21 wherein the means for passing a current comprises a current determiner associated with the main battery.

23. The battery system of claim 20 wherein the main battery comprises a lithium battery.

24. A method for determining a battery condition in a system delivering electrical power from a main battery to a load, the main battery comprising a main battery cell, the method comprising the following steps:

providing a sense cell that is substantially identical to the main battery cell;

affecting a property of the sense cell in a manner related to main battery remaining capacity;

monitoring a parameter of the sense cell; and determining a condition of the main battery from the monitored sense cell parameter.

25. The method of claim 24 wherein the affecting step comprises passing a current through the sense cell.

26. The method of claim 24 further comprising the step of providing a programmable load electrically connected to the sense cell, wherein the affecting step comprises adjusting the programmable load.

27. A method for determining a battery condition in a system delivering electrical current from a main battery to a load, the method comprising the following steps:

determining the current delivered from the main battery to the load;

drawing a current from a sense cell that is greater than the current delivered from the main battery to the load;

monitoring a parameter of the sense cell; and determining a condition of the main battery from the monitored sense cell parameter.

28. The method of claim 27 wherein the drawing step comprises the step of drawing a current from a sense cell that is substantially identical to a main battery cell in the main battery.

29. The method of claim 27 further comprising the step of delivering current from the sense cell to the load in series with the main battery.

30. The method of claim 27 wherein the main battery is part of a main battery circuit, the sense cell not being connected to the main battery circuit.

31. A method for determining a battery condition in a system delivering electrical current from at least first and second battery cells to a load, the method comprising the following steps:

determining the current delivered from the first battery cell to the load;

accelerating the discharge of the second battery cell with respect to the discharge of the first battery cell;

monitoring a parameter of the second battery cell; and determining a condition of the first battery cell from the monitored second battery cell parameter.

* * * * *

UNITED STATES PATENT AND TRADEMARK OFFICE
CERTIFICATE OF CORRECTION

PATENT NO. : 5,483,165
DATED : Jan. 9, 1996
INVENTOR(S) : David Bradley Cameron, et al It is certified that error appears in the above-indentified patent and that said Letters Patent is hereby corrected as shown below:

On the Cover Page

At [75], "David B. Cameron" should be —David Bradley Cameron—.

In Column 4, line 53, "indicator the" should be —indicator, the—.

Signed and Sealed this

Fifteenth Day of July, 1997

*Attest:*

BRUCE LEHMAN

*Attesting Officer*   Commissioner of Patents and Trademarks